March 19, 1968 R. I. HARRISON ET AL 3,374,433

MICROWAVE POWER DETECTOR UTILIZING DIFFUSION OF HOT CARRIERS IN A SEMICONDUCTOR

Filed May 20, 1964

INVENTOR.
RICHARD I. HARRISON
JOSEPH ZUCKER

BY R. J. Frank

ATTORNEY.

United States Patent Office 3,374,433
Patented Mar. 19, 1968

3,374,433

MICROWAVE POWER DETECTOR UTILIZING DIFFUSION OF HOT CARRIERS IN A SEMICONDUCTOR

Richard I. Harrison, Jericho, and Joseph Zucker, Queens, N.Y., assignors to General Telephone and Electronic Laboratories, Inc., a corporation of Delaware Filed May 20, 1964, Ser. No. 368,879
9 Claims. (Cl. 324—106)

ABSTRACT OF THE DISCLOSURE

A microwave cavity power detector is described in which one wall of the cavity is formed of semiconductor material having a low carrier concentration. The currents induced in the semiconductor wall form a standing wave pattern having maximum and minimum values. By locating contacts at the locations of both the maxima and minima, the diffusion of hot carriers in the wall results in a voltage between contacts which is a function of the power in the cavity.

This invention relates to apparatus for detecting microwave power and particularly to a detector utilizing the bulk thermoelectric effect caused by the diffusion of "hot carriers" in semiconductor material.

The increased use of higher frequencies for electromagnetic power transmission in recent years has created a great need for rugged, reliable power detecting devices capable of operation over a broad band of frequencies at high power levels. In practice, microwave power detectors should exhibit a minimum variation in electrical impedance at different microwave frequencies and power levels to insure that highly accurate measurements are attained.

Power detection apparatus employing many types of semiconductor material are known. However, these known devices are primarily junction-type semiconductor apparatus and do not utilize a bulk effect of semiconductor material. As a result, the devices are found to exhibit significant variations in electrical impedance when subjected to different high frequency power levels. This variation is due in part to the field dependent capacitance exhibited by junction-type devices. In addition, junction-type devices are generally more temperature sensitive than bulk effect semiconductor devices and their impedance varies significantly with changes in environmental conditions.

The present invention is directed to the provision of a novel microwave cavity power detector capable of detecting the level of electromagnetic power in a cavity and the amplitude modulation thereof with a high degree of accuracy.

This invention utilizes the bulk thermoelectric effect of "hot carriers" in semiconductor material to provide an output signal which is either an indication of the microwave power in the cavity or the amplitude modulation thereon as desired for a particular application. A carrier in semiconductor material becomes a "hot carrier" when its average energy exceeds the energy of the semiconductor lattice structure. The bulk thermoelectric effect is produced by the preferential diffusion of the "hot carriers" to regions wherein the carriers are not "hot" and is characterized by an electromotive force being generated within the semiconductor. This electromotive force is independent of inhomogeneities in the semiconductor such as p-n junctions or Schottky barriers. By utilizing the bulk semiconductor effect, a detector which is more rugged and easier to manufacture than junction-type detectors is obtained.

In addition, the present detector is found to be less subject to ambient or environmental changes than known devices performing similar operations. Also, the device is found to be suited for operation over a wide temperature range, from below liquid nitrogen temperatures to above room temperatures, and can operate at extremely high power levels on the order of hundreds of kilowatts without experiencing burnout.

The invention employs a dissipative element having only the field-independent lattice capacitance inherent in semiconductor materials, thereby permitting measurements to be made over a wide microwave power range. A further advantage is that the need for a cartridge or specially adapted waveguide mount necessary in known devices performing similar operations is obviated by the construction of the invention.

In accordance with the present invention, a wafer of semiconductor material is formed as one wall of a microwave cavity. The microwave electric fields present in the cavity induce currents of the same high frequency in the semiconductor wall. These currents in the wall form a standing wave pattern therein which is dependent on the mode of the microwave power in the cavity. This standing wave pattern has maximum and minimum values, thereby resulting in different regions of the wall having high and low power densities.

The majority carrier concentration of the semiconductor wall is selected to be less than $10^{16}$ carriers per cubic centimeter at room temperature and therefore those carriers located in regions of high power density are exposed to a relatively high power per individual carrier. The rate at which power is absorbed by these carriers exceeds the rate at which the carriers can dissipate this energy and therefore the average energy or temperature of the carriers rises until a new steady-state condition is reached.

The heated carriers in the region of high power density diffuse preferentially toward a region of lower power density where the carriers have a lower average energy. The resultant change in charge distribution due to "hot carrier" movement generates a thermoelectric voltage between regions of high and low power density which is a function of the power in the cavity.

To effectively utilize this generated voltage, an ohmic metal contact is affixed to the semiconductor wall in a region of high power density. This contact is selected or treated so that when contacting the wall no Schottky barrier or p-n junction is established therebetween, thus permitting the detector to employ the bulk effect of the semiconductor wafer.

A second contact exhibiting a low impedance at the cavity frequency, is affixed to the semiconductor wall at a region of minimum power density. The diffusion of "hot carriers" then results in the generation of a thermoelectric voltage between these contacts which is a function of the microwave power in the cavity and which is readily supplied to amplifying or measuring means as desired.

Further features and advantages of the invention will become more readily apparent from the following description of a specific embodiment as shown in the accompanying drawings in which.

Figure 4:
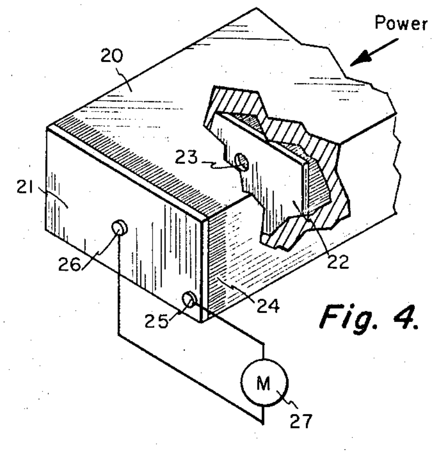

FIGS. 3*a* through 3*f* show the various waveforms associated with this embodiment of the invention; and FIG. 4 is a view in perspective of a second embodiment.

Figures 1, 2:
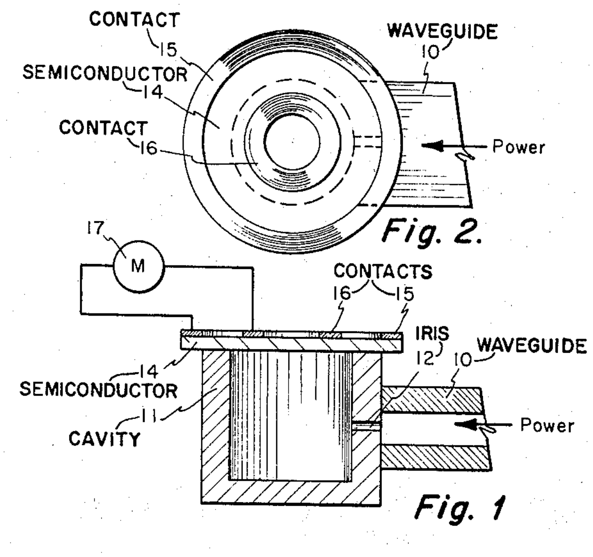
FIG. 1 is a cross-section of one embodiment of the invention.
FIG. 2 is a top view of the embodiment shown in FIG. 1.

Referring more particularly to FIG. 1, rectangular waveguide 10 is shown coupled to cylindrical cavity 11 through coupling iris 12.

The dimensions of cylindrical cavity 11 are chosen such that it resonates at the input frequency in the circular electric or $TE_{01n}$ mode, where $n$ is an integer equal to the number of times the electric field pattern is repeated along the cavity axis. This mode is highly desirable in cylindrical cavities, as the currents excited in the cavity end walls flow in concentric circular paths with the center thereof coinciding with the cavity axis. For this mode, no current flow occurs between the cavity end walls and the cylindrical cavity wall so that the contact impedance therebetween produces substantially no perturbation on the mode.

Coupling iris 12 is chosen to have the proper axial position, shape and hole size such that the $TE_{01n}$ mode at the frequency of interest is excited within the cavity. Since the coupling of a rectangular waveguide to a cylindrical cavity is well known in the art and forms no part of the present invention further explanation is felt unnecessary.

As shown, semiconductor wafer 14 forms one end wall of the cavity 11 and therefore current flows therein. The wafer may be connected to the metal cylindrical wall of the cavity in this embodiment in any convenient mechanical manner, such as soldering, cementing, or held in place by pressure, without regard to the electrical properties of the connection since there is no current flow therebetween. The current flowing in wafer 14 has a readily definable maximum and as known in the art, the current maximum for $TE_{01n}$ modes is found at a distance of 0.48 times the cavity radius from the cavity axis. The current in wafer 14 is minimized or substantially zero in the circular region adjacent the cylindrical wall of the cavity. Wafer 14 is shown extending laterally outward of the cylindrical cavity wall to increase the region of substantially zero current density. The above mentioned current maximum and minimum regions correspond to the regions of wafer 14 having maximum and minimum power densities therein.

The thickness of water 14 is advantageously chosen to be a skin-depth or less at the microwave frequency of interest. The skin depth is a function of the resistivity ($p$) and the permeability ($\mu$) of free space as well as the frequency of interest ($f$) and is expressed by the following equation $$\text{Skin depth in meters}=[p/\pi f\mu]^{1/2}$$

For example, a semiconductor having a resistivity of 1 ohmmeter at 70 gigacycles has a skin depth of 74.88 mils or .0019 meters. By utilizing a semiconductor wafer having a thickness less than a skin depth, the current and power density are substantially uniform thereacross and are not confined to that region adjacent the inner surface of the wafer. Although a semiconductor wafer having a thickness greater than a skin depth may be used, the sensitivity of the detector is substantially decreased due to the unequal current distribution thereacross.

Wafer 14 is formed of semiconductor material such as germanium, silicon and the like. The semiconductor material is lightly-doped by the addition of impurities to make either a p-type or n-type extrinsic semiconductor wafer. As known in the art impurities from Group III of the Periodic Table will provide a p-type wafer while those of Group V provide an n-type wafer. However, intrinsic semiconductor materials may be employed if desired.

The majority carriers of the semiconductor wafer 14 become "hot carriers" when the average energy of the carriers exceeds the energy of the associated lattice. Depending on the type of doping used, these carriers may be either "hot holes" or "hot electrons."

The carriers in wafer 14 located in a region of high current of power density absorb power and experience a sharp increase in average energy. If the semiconductor carrier concentration is light, for example less than $10^{16}$ carriers per cubic centimeter at room temperatures, each carrier in a region of high power density will accordingly absorb a significant portion of the power. As the carrier concentration of the wafer is reduced, the power available per individual carrier increases and for reasons that will later become apparent, the sensitivity of the detector is also increased.

However, the carriers in wafer 14 located in a region of minimum or substantially zero power density experience no measurable increase in average energy. These carriers are maintained essentially in thermal equilibrium with the lattice of the semiconductor wafer and do not become "hot carriers."

The lattice temperature is found to be substantially constant throughout semiconductor wafer 14 so that a carrier temperature gradient exists within wafer 14 due to the absorption of energy by those carriers located in the region of high power density. This temperature gradient and uneven heating of the carriers results in a diffusion of the more energetic carriers in the region of high power density to regions of low power density, and, in this embodiment, to the portion of wafer 14 adjacent the cylindrical wall of cavity 11.

The redistribution or diffusion of the carriers serves to generate an electromotive force between high and low power density regions which is a function of the power in the cavity.

As shown in FIGS. 1 and 2, concentric circular contacts 15 and 16 are mounted on the outer face of wafer 14 with the cavity axis as their center. Both contacts may be formed on the wafer by alloying or diffusion techniques.

Contact 16 is a metallic contact, such as gold, indium or the like, selected or treated such that no Schottky barrier or p-n junction is formed when it contacts wafer 14. One method of forming contact 16 is by electroplating gold doped with a suitable Group III or Group V impurity and then heating to 450° C. in a reducing atmosphere for a few minutes. The ohmic contact 16 is positioned on the wafer at a distance of 0.48 times the cavity radius from the cavity axis to insure its location in the region of maximum power density.

It is to be noted that for the $TE_{01n}$ mode the power density maximum is defined by the above circle. However other modes existing in cavity 11 would produce a standing pattern in wafer 14 having maximum and minimum regions of power density unlike that of the $TE_{01n}$ mode. These modes are generally characterized by the presence of several power density maxima and minima. For embodiments utilizing other modes, an ohmic contact must be positioned in a region corresponding to one of the power density maxima. Also, if a mode other than the $TE_{01n}$ mode is excited in cavity 11, the current induced by the microwave electric field in the cavity will flow through the connection between cavity wall 14 and the cylindrical cavity wall requiring an ohmic contact to be made between wall 14 and the cylindrical wall. Thus, the connection between the metal cavity and the semiconductor wall does not disturb the microwave current flow therebetween.

Further, to insure the proper location of high power density contact 16 in any embodiment it is advantageous to provide an ohmic contact having a major dimension that is small compared to a half-wavelength of the standing wave pattern in the cavity. This is desirable to prevent the ohmic contact from extending into low power density regions as well as high power density regions in the wafer.

Circular metallic contact 15 is seen in FIG. 1 mounted on that portion of the semiconductor extending laterally outward of the cylindrical wall of cavity 11. This is to insure that contact 15 is located outside the cavity fields in a region of substantially zero power density. However, contact 15 may be placed directly above the cylindrical wall of cavity 11 if desired. Contact 15 preferably is also an ohmic contact, although its location in a region of substantially zero power density permits other contacts exhibiting a low impedance at the frequency of interest to be employed.

Contacts 15 and 16 are preferably ring contacts as shown, due to the low impedance exhibited thereby. However, it is to be understood that dot contacts or other contact configurations may be employed if positioned in regions of high and low power density.

The redistribution or diffusion of the carriers serves to generate a thermoelectric voltage between regions of high and low power density and therefore between contacts 15 and 16. The magnitude of this voltage is dependent on the heating of the carriers and is therefore a function of the microwave power in cavity 11.

Figures 3A, 3B, 3C, 3D, 3E, 3F:
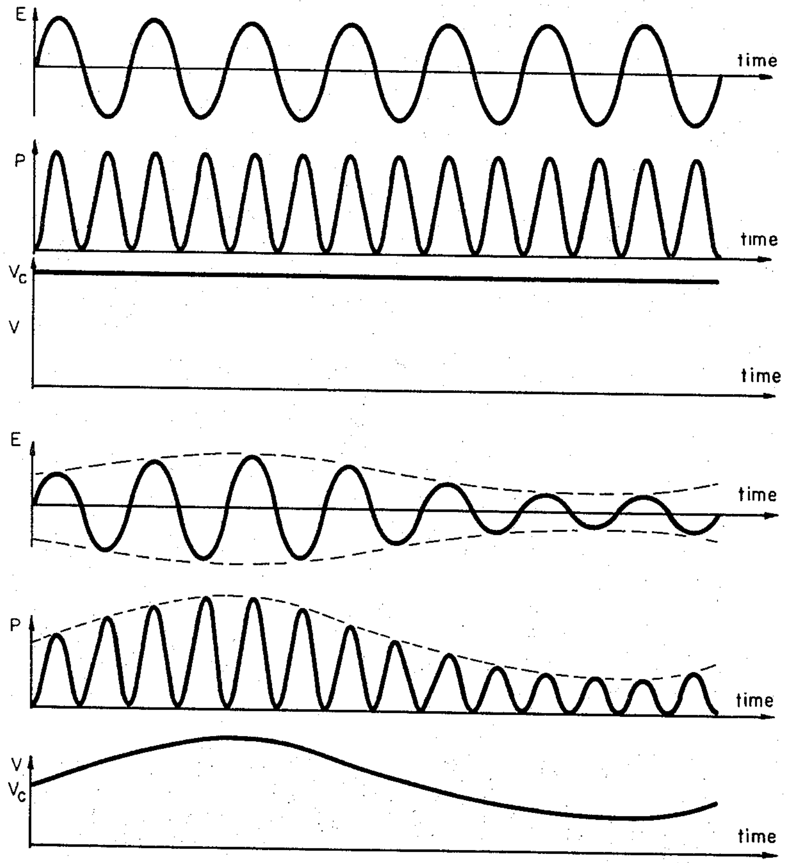

Referring now to the waveforms of FIGS. 3*a* through 3*f*, the waveform of FIG. 3*a* shows the unmodulated microwave electric field existing in the cavity, while the waveform of FIG. 3*b* indicates the power density in the semiconductor wafer proximate contact 16. As power density is proportional to the square of the electric field it will have a positive although varying magnitude throughout an entire period.

Initially, the rate at which power is absorbed by the carriers residing in wafer 14 proximate contact 16 exceeds the rate at which these carriers can transfer this additional energy to the semiconductor lattice. The average energy rises until a new equilibrium condition is reached with the lattice. This new condition is characterized by a heating of the carriers to a temperature higher than the lattice temperature.

By utilizing a semiconductor material with the aforementioned carrier concentation, the carriers are found to have an energy relaxation time in the order of $10^{-11}$ seconds. This time constant is a measure of the time required for the carriers to achieve an equilibrium condition at the new temperature. Also, microwave power density having a frequency greater than the reciprocal of the carrier energy relaxation time will raise the carrier to a substantially constant new temperature level. This is due to the inability of the carriers to absorb and release energy as fast as the periodic power density in the wafer varies.

The semiconductor material of wafer 14 has a dielectric relaxation time which is related to the time required for the generation of a thermoelectric voltage by carriers experiencing a given change in carrier temperature. This quantity is found to be the product of the D–C resistivity of the semiconductor material and the dielectric constant and has a value which may be an order of magnitude smaller than the carrier energy relaxation time. Therefore, power density having a frequency greater than either of the reciprocals of the carrier energy and the dielectric relaxation times will generate a D–C thermoelectric output voltage $V_c$ as shown by the waveform of FIG. 3*c*.

However, for microwave power density having a frequency less than both the reciprocals of the dielectric relaxation time and the carrier relaxation time, the thermoelectric voltage generated by the diffusion of the carriers varies periodically in substantial correspondence with the power density waveform.

As shown by the waveforms of FIG. 3*d*, FIG. 3*e*, and FIG. 3*f*, the invention may be readily employed to demodulate amplitude modulated microwave signals. The frequency of the modulation signal will of course be significantly less than that of the high frequency carrier and therefore will be less than the reciprocals of the carrier energy and dielectric relaxation time. Thus, the carrier diffusion is able to follow the variation in power density in wafer 14 from the application of the modulated carrier signal of FIG. 3*d*. This is illustrated by the waveform of FIG. 3*f* showing the varying thermoelectric output voltage corresponding to the power density of the waveform of FIG. 3*e*.

The thermoelectric voltage generated between contacts 15 and 16 may be supplied to external reading means 17, such as a D–C voltmeter. Alternatively, indicating means, such as an oscilloscope, responsive to the varying component of the output voltage may be employed to provide an indication of the amplitude modulation on the microwave carrier. Also, the output voltage may be supplied to either an audio or video amplifier depending on the type of modulation employed. The polarity of this voltage depends on the majority carrier present in wafer 14 and for n-type material contact 16 will be positive with respect to contact 15.

In a particular embodiment made of n-type germanium with arsenic doping and tested and operated at a frequency of 70 gigacycles, the wafer thickness was 10 mils and the carrier concentration was $10^{14}$ carriers per cubic centimeter at room temperatures. The embodiment used in conjunction with an oscilloscope was found to detect signal levels of milliwatts with bandwidths of 10 megacycles while being able to operate at peak power levels in the kilowatt range. The output voltage generated was found to be one millivolt for an input power of one milliwatt.

The invention may also be employed with rectangular waveguide cavity 20, as shown in FIG. 4, by forming end wall 21 of semiconductor material having a carrier concentration not exceeding $10^{16}$ carriers per cubic centimeter at room temperatures. Opposing end wall 22 contains coupling iris 23 having a size and position determined by the particular microwave mode and frequency to be excited in cavity 20.

Since rectangular cavities have high frequency currents flowing between the end wall and the side walls, an ohmic contact 24 is provided between end wall 21 and the adjacent walls of cavity 20. This contact may be formed by techniques similar to that used in forming contact 26.

Contact 26 is an ohmic contact and is positioned on the outer face of end wall 21 in a region of substantially maximum power density. In the embodiment shown, contact 26 is mounted on a line parallel to the narrow dimension of end wall 21 and passing through the center thereof. Contact 25, having a low impedance at the frequency of interest is shown positioned adjacent the edge of the narrow dimension of end wall 21. By placing the contacts in the above manner, the embodiment detects power in the $TE_{10}$ mode in cavity 20 wherein the power density in end wall 21 is a maximum along the line on which ohmic contact 26 is located and the minimum power density is found along either narrow dimension. Thus, indicating means 27 connected between contacts 25 and 26 indicates the thermoelectric voltage due to the diffusion of "hot carriers" generated therebetween.

For cavities containing higher order microwave modes, the locations of the current maxima and minima are different than in the aforementioned embodiments. However placing the contacts in the corresponding high and low power density regions, the invention can be used to detect microwave power in any modal pattern.

While the above discussion has described particular embodiments of the invention, it is understood that many changes in these embodiments may be made within the spirit and scope of the invention and that other embodiments utilizing the principles of the invention may be made.

What is claimed is:

1. Apparatus for detecting microwave power in a cavity which comprises (a) a microwave cavity having one wall thereof formed of semiconductor material, said wall having a carrier concentration not exceeding $10^{16}$ carrier per cubic centimeter, said wall having a standing wave pattern of current induced therein by the microwave power in said cavity, (b) an ohmic first contact mounted on the outer face of said semiconductor cavity wall and positioned in a region of substantially maximum power density the carriers in the region underlying said first contact being heated to a higher average energy, said heated carriers diffusing to regions of minimum power density, and (c) a second contact having a low impedance at the microwave frequency of interest mounted on the outer face of said cavity in a region of substantially minimum power density, the carriers in the region underlying said second contact experiencing no substantial increase in average energy, a voltage which is a function of the microwave power in the cavity being generated between said contacts due to the diffusion of "hot carriers" from the region underlying said first contact to the region underlying said second contact in the semiconductor wall.

2. Apparatus for detecting microwave power in a cavity which comprises (a) a microwave cavity having one wall thereof formed of semiconductor material having a carrier concentration not exceeding $10^{16}$ carriers per cubic centimeters, said semiconductor wall having a thickness not greater than a skin depth at the microwave frequency of interest, said wall having a standing wave pattern of current induced therein by the microwave pawer in said cavity, (b) an ohmic first contact mounted on the outer face of said semiconductor cavity wall and positioned in a region of substantially maximum power density the carriers in the region underlying said first contact being heated to a higher average energy, said heated carriers diffusing to regions of maximum power density, and (c) a second contact having a low impedance at the microwave frequency of interest mounted on the outer face of said cavity in a region of substantially minimum power density, the carriers in the region underlying said second contact experiencing no substantial increase in average energy, a voltage which is a function of the microwave power in the cavity being generated between said contacts due to the diffusion of "hot carriers" from the region underlying said first contact to the region underlying said second contact in the semiconductor wall.

3. Apparatus for detecting microwave power in a cavity which comprises (a) a microwave cavity having one wall thereof formed of semiconductor material having a carrier concentration not exceeding $10^{16}$ carriers per cubic centimeter, said semiconductor wall having a thickness not greater than a skin depth at the microwave frequency of interest, said wall having a standing wave pattern of current induced therein by the microwave power in said cavity, (b) a first ohmic contact formed between said semiconductor wall and adjacent cavity wall, (c) a second ohmic contact positioned on the outer face of said semiconductor wall in a region of substantially maximum power density the carriers in the region underlying said second contact being heated to a higher average energy, said heated carriers diffusing to regions of minimum power density, and (d) a third contact having a low impedance at the microwave frequency of interest positioned on the outer face of said cavity in a region of substantially minimum power density, the carriers in the region underlying said third contact experiencing no substantial increase in average energy, a voltage which is a function of the microwave power in the cavity being generated between said second and third contacts due to the diffusion of "hot carriers" from the region underlying said second contact to the region underlying said third contact in the semiconductor wall.

4. Apparatus for detecting microwave power which comprises (a) a microwave cavity having one wall thereof formed of semiconductor material having a carrier concentration not exceeding $10^{16}$ carriers per cubic centimeter, said semiconductor wall having a thickness not greater than a skin depth of the microwave frequency of interest said wall having a standing wave pattern of current induced therein by the microwave power in said cavity, (b) means for coupling microwave power into said cavity, (c) an ohmic first contact mounted on the outer face of said semiconductor cavity wall and positioned in a region of substantially maximum power density the carriers in the region underlying said first contact being heated to a higher average energy, said heated carriers diffusing to regions of minimum power density, and (d) a second contact having a low impedance at the microwave frequency of interest mounted on the outer face of said cavity in a region of substantially minimum power density, the carriers in the region underlying said second contact experiencing no substantial increase in average energy, a voltage which is a function of the microwave power in the cavity being generated between said contacts due to the diffusion of "hot carriers" from the region underlying said first contact to the region underlying said second contact in the semiconductor wall.

5. Apparatus for detecting microwave power which comprises (a) a microwave cavity having one wall thereof formed of semiconductor material having a carrier concentration not exceeding $10^{16}$ carriers per cubic centimeter, said semiconductor wall having a thickness not greater than skin depth at the microwave frequency of interest, (b) an ohmic contact mounted on the outer face of said semiconductor cavity wall and positioned in a region of substantially maximum power density, (c) a second contact having a low impedance at the microwave frequency of interest mounted on the outer face of said cavity in a region of substantially minimum power density, and (d) means connected to said contacts for indicating the voltage which is a function of the microwave power in the cavity generated between said contacts due to the diffusion of "hot carriers" in the semiconductor wall.

6. Apparatus for detecting microwave power in a cavity which comprises (a) microwave cavity having one wall thereof formed of semiconductor material having a carrier concentration not exceeding $10^{16}$ carriers per cubic centimeter, said semiconductor wall having a thickness not greater than a skin depth at the microwave frequency of interest, said wall having a standing wave pattern of current induced therein by the microwave power in said cavity, (b) a first ohmic contact mounted on the outer face of said semiconductor cavity wall and positioned in a region of substantially maximum power density, the carriers in the region underlying said first contact being heated to a higher average energy, said heated carriers diffusing to regions of minimum power density, and (c) a second ohmic contact mounted on the outer face of the semiconductor cavity wall and positioned in a region of substantially minimum power density, the carriers in the region underlying said second contact experiencing no substantial increase in average energy, a voltage which is a function of the microwave power in the cavity being generated between said contacts due to the diffusion of "hot carriers" from the region underlying said first contact to the region underlying said second contact in the semiconductor wall.

7. Apparatus for detecting microwave power which comprises (a) a circular microwave cavity having an end wall thereof formed of semiconductor material having a carrier concentration not exceeding $10^{16}$ carriers per cubic centimeter, said semiconductor wall having a thickness not greater than a skin depth at the microwave frequency of interest, said wall having a standing wave pattern of current induced therein by the microwave power in said cavity, (b) an ohmic first contact mounted on the outer face of said semiconductor end wall and positioned in a region of substantially maximum power density the carriers in the region underlyiing said first contact being heated to a higher average energy, said heated carriers diffusing to regions of minimum power density, and (c) a second contact having a low impedance at the microwave frequency of interest mounted on the outer face of the semiconductor cavity wall and positioned in a region of substantially minimum power density, the carriers in the region underlying said second contact experiencing no substantial increase in average energy, a voltage which is a function of the microwave power in the cavity being generated between said contacts due to the diffusion of "hot carriers" from the region underlying said first contact to the region underlying said second contact in the semiconductor wall.

8. Apparatus for detecting microwave power which comprises (a) a circular microwave cavity in which the circular electric mode is excited at the frequency of interest and having an end wall thereof formed of semiconductor material having a carrier concentration not exceeding $10^{16}$ carriers per cubic centimeter, said semiconductor wall having a thickness not greater than a skin depth at the microwave frequency of interest, said wall having a standing wave pattern of current induced therein by the microwave power in said cavity, (b) an ohmic first contact mounted on the outer face of said semiconductor end wall and positioned in a region of substantially maximum power density the carriers in the region underlying said first contact being heated to a higher average energy, said heated carriers diffusing to regions of minimum power density, and (c) a second cavity having a low impedance at the microwave frequency of interest mounted on the outer face of the semiconductor cavity wall and positioned in a region of substantially minimum power density, the carriers in the region underlying said second contact experiencing no substantial increase in average energy, a voltage which is a function of the microwave power in the cavity being generated between said contacts due to the diffusion of "hot carriers" from the region underlying said first contact to the region underlying said second contact in the semiconductor wall.

9. Apparatus for detecting microwave power which comprises (a) a rectangular microwave cavity having one wall thereof formed of semiconductor material having a carrier concentration not exceeding $10^{16}$ carriers per cubic centimeter, said semiconductor wall having a thickness not greater than a skin depth at the microwave frequency of interest, said wall having a standing wave pattern of current induced therein by the microwave power in said cavity, (b) a first ohmic contact formed between said semiconductor wall and the adjacent cavity walls, (c) a second ohmic contact mounted on the outer face of the semiconductor wall and positioned in a region of substantially maximum power density the carriers in the region underlying said second contact being heated to a higher average energy, said heated carriers diffusing to regions of minimum power density, and (d) a second contact having a low impedance at the microwave frequency of interest mounted on the outer face of the semiconductor cavity wall and positioned in a region of substantially minimum power density, the carriers in the region underlying said third contact experiencing no substantial increase in average energy, a voltage which is a function of the microwave power in the cavity being generated between said contacts due to the diffusion of "hot carriers" from the region underlying said second contact to the region underlying said third contact within the semiconductor wall.

References Cited

UNITED STATES PATENTS

| | | | |
|---|---|---|---|
| 2,974,223 | 3/1961 | Langberg | 328—20 X |
| 3,001,134 | 9/1961 | Conwell | 324—95 |
| 3,001,135 | 9/1961 | Many | 324—95 |

OTHER REFERENCES

Basic Course in Semiconductors and Technology, Dr. E. H. Borneman, MB 1963, Semiconductor Division, Westinghouse Elec. Corp., Youngwood, Pa.

RUDOLPH V. ROLINEC, *Primary Examiner.*

J. J. MULROONEY, E. F. KARLSEN, *Assistant Examiners.*